(12) United States Patent
Lin et al.

(10) Patent No.: US 12,200,336 B2
(45) Date of Patent: Jan. 14, 2025

(54) PORTABLE ELECTRONIC DEVICE, AND IMAGE-CAPTURING DEVICE AND ASSEMBLY METHOD THEREOF

(71) Applicant: Shine Optics Technology Company Limited, Chongqing (CN)

(72) Inventors: Jie-Qiao Lin, Chongqing (CN); Li-Hsueh Chan, New Taipei (TW); Feng Zhou, Chongqing (CN); Kung-An Lin, Taipei (TW); Hang Dong, Chongqing (CN)

(73) Assignee: Shine Optics Technology Company Limited, Chongqing (CN)

( * ) Notice: Subject to any disclaimer, the term of this patent is extended or adjusted under 35 U.S.C. 154(b) by 196 days.

(21) Appl. No.: 18/098,432

(22) Filed: Jan. 18, 2023

(65) Prior Publication Data
US 2023/0239556 A1     Jul. 27, 2023

(30) Foreign Application Priority Data
Jan. 24, 2022  (CN) .......................... 202220230598.3

(51) Int. Cl.
*H04N 23/57*   (2023.01)
*H04N 17/00*   (2006.01)
*H04N 23/54*   (2023.01)
*H05K 1/18*    (2006.01)

(52) U.S. Cl.
CPC ........... *H04N 23/54* (2023.01); *H04N 17/002* (2013.01); *H04N 23/57* (2023.01); *H05K 1/183* (2013.01); *H05K 2201/10151* (2013.01)

(58) Field of Classification Search
CPC ............................... H04N 23/54; H04N 23/57
See application file for complete search history.

(56) References Cited

U.S. PATENT DOCUMENTS

2017/0200755 A1   7/2017  Teng et al.
2018/0332202 A1*  11/2018 Lee ...................... H04N 25/76
(Continued)

FOREIGN PATENT DOCUMENTS

| CN | 216625877 U | 5/2022 |
|---|---|---|
| CN | 216928592 U | 7/2022 |
| TW | 201541138 A | 11/2015 |

(Continued)

*Primary Examiner* — Michael H Hong
(74) *Attorney, Agent, or Firm* — Li & Cai Intellectual Property (USA) Office

(57) ABSTRACT

A portable electronic device, and an image-capturing device and an assembly method thereof are provided. The image-capturing device includes a carrier substrate, an image sensing chip, a filter element and a lens assembly. The carrier substrate has a through opening and a recessed space. The image sensing chip is disposed on the bottom side of the carrier substrate. The filter element is disposed in the recessed space of the carrier substrate, so that all or a part of the filter element is accommodated in the through opening. When at least one microparticle with a maximum particle size between 5 μm and 25 μm is located on the filter element, a shortest distance between the filter element and the image sensing chip is between 30 μm and 200 μm, so that the image sensing chip cannot capture a light spot generated due to blocking of the microparticle.

10 Claims, 8 Drawing Sheets

(56) References Cited

U.S. PATENT DOCUMENTS

2019/0148429 A1  5/2019  Wang et al.
2020/0176496 A1  6/2020  Kimura et al.

FOREIGN PATENT DOCUMENTS

| TW | 201735335 A | 10/2017 |
| TW | M553428 U | 12/2017 |
| TW | I635348 B | 9/2018 |
| TW | 201902206 A | 1/2019 |

\* cited by examiner

PORTABLE ELECTRONIC DEVICE, AND IMAGE-CAPTURING DEVICE AND ASSEMBLY METHOD THEREOF

CROSS-REFERENCE TO RELATED PATENT APPLICATION

This application claims the benefit of priority to China Patent Application No. 202220230598.3, filed on Jan. 24, 2022, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a portable electronic device, and an image-capturing device and an assembly method thereof, and more particularly to a portable electronic device for improving the quality of captured images, and an image-capturing device and an assembly method thereof for improving the quality of captured images.

BACKGROUND OF THE DISCLOSURE

In the image-capturing device of the related art, the filter is supported by a plurality of short brackets to be arranged on the image sensor chip. However, the stability of a single short bracket and the flatness of the short brackets are not easy to control, and the short bracket that cannot be too high will make the filter and the image sensor chip too close, so that the microparticles on the filter will be captured by the image sensor chip (that is to say, the image sensor chip will capture the light spots caused by the blocking of microparticles).

SUMMARY OF THE DISCLOSURE

In response to the above-referenced technical inadequacy, the present disclosure provides a portable electronic device, and an image-capturing device and an assembly method thereof, for improving the image-capturing quality.

In order to solve the above-mentioned problems, one of the technical aspects adopted by the present disclosure is to provide an image-capturing device, which includes a carrier substrate, an image sensing chip, a filter element and a lens assembly. The carrier substrate has a top side, a bottom side, a through opening connected between the top side and the bottom side, and a recessed space communicated with the through opening. The image sensing chip is disposed on the bottom side of the carrier substrate and electrically connected to the carrier substrate. The filter element is configured for corresponding to the image sensing chip, and the filter element is disposed in the recessed space of the carrier substrate, so that all or a part of the filter element is accommodated in the through opening. The lens assembly is configured for corresponding to the image sensing chip, and the lens assembly includes a lens holder disposed on the top side of the carrier substrate and an optical lens carried by the lens holder. When at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

In order to solve the above-mentioned problems, another one of the technical aspects adopted by the present disclosure is to provide an assembly method of an image-capturing device, which includes placing at least one test microparticle with a maximum particle size between 5 µm and 25 µm on a test filter element; adjusting a shortest distance from the test filter element to a test image sensor chip until the test image sensor chip cannot capture a light spot generated due to blocking of the at least one test microparticle, in order to obtain a reference data of the shortest distance between the test filter element and the test image sensor chip ranging from 30 µm to 200 µm; and according to the reference data, placing an image sensing chip, a filter assembly and a lens assembly on a carrier substrate, so that a shortest distance between the filter element and the image sensing chip is between 30 µm and 200 µm. The carrier substrate has a top side, a bottom side, a through opening connected between the top side and the bottom side, and a recessed space communicated with the through opening. The image sensing chip is disposed on the bottom side of the carrier substrate and electrically connected to the carrier substrate. The filter element is configured for corresponding to the image sensing chip, and the filter element is disposed in the recessed space of the carrier substrate, so that all or a part of the filter element is accommodated in the through opening. The lens assembly is configured for corresponding to the image sensing chip, and the lens assembly includes a lens holder disposed on the top side of the carrier substrate and an optical lens carried by the lens holder. When at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

In order to solve the above-mentioned problems, yet another one of the technical aspects adopted by the present disclosure is to provide a portable electronic device configured to use an image-capturing device, and the image-capturing device includes a carrier substrate, an image sensing chip, a filter element and a lens assembly. The carrier substrate has a top side, a bottom side, a through opening connected between the top side and the bottom side, and a recessed space communicated with the through opening. The image sensing chip is disposed on the bottom side of the carrier substrate and electrically connected to the carrier substrate. The filter element is configured for corresponding to the image sensing chip, and the filter element is disposed in the recessed space of the carrier substrate, so that all or a part of the filter element is accommodated in the through opening. The lens assembly is configured for corresponding to the image sensing chip, and the lens assembly includes a lens holder disposed on the top side of the carrier substrate and an optical lens carried by the lens holder. When at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

Therefore, in the image-capturing device provided by the present disclosure, by virtue of "the carrier substrate having a top side, a bottom side, a through opening connected between the top side and the bottom side, and a recessed space communicated with the through opening," "the image sensing chip being disposed on the bottom side of the carrier substrate and electrically connected to the carrier substrate" and "the filter element being disposed in the recessed space of the carrier substrate, so that all or a part of the filter element is accommodated in the through opening," the image-capturing quality of the image-capturing device can be improved. More particularly, when at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

Moreover, in the assembly method of the image-capturing device provided by the present disclosure, by virtue of "placing at least one test microparticle with a maximum particle size between 5 µm and 25 µm on a test filter element," "adjusting a shortest distance from the test filter element to a test image sensor chip until the test image sensor chip cannot capture a light spot generated due to blocking of the at least one test microparticle, in order to obtain a reference data of the shortest distance between the test filter element and the test image sensor chip ranging from 30 µm to 200 µm" and "according to the reference data, placing an image sensing chip, a filter assembly and a lens assembly on a carrier substrate, so that a shortest distance between the filter element and the image sensing chip is between 30 µm and 200 µm," the image-capturing quality of the image-capturing device can be improved. More particularly, when at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

Furthermore, in the portable electronic device using the image-capturing device provided by the present disclosure, by virtue of "the carrier substrate having a top side, a bottom side, a through opening connected between the top side and the bottom side, and a recessed space communicated with the through opening," "the image sensing chip being disposed on the bottom side of the carrier substrate and electrically connected to the carrier substrate" and "the filter element being disposed in the recessed space of the carrier substrate, so that all or a part of the filter element is accommodated in the through opening," the image-capturing quality of the image-capturing device that is used by the portable electronic device can be improved. More particularly, when at least one microparticle with a maximum particle size between 5 µm and 25 µm is located on the filter element, a shortest distance between the filter element and the image sensing chip is between 30 µm and 200 µm, so that the image sensing chip cannot capture a light spot generated due to blocking of the at least one microparticle.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
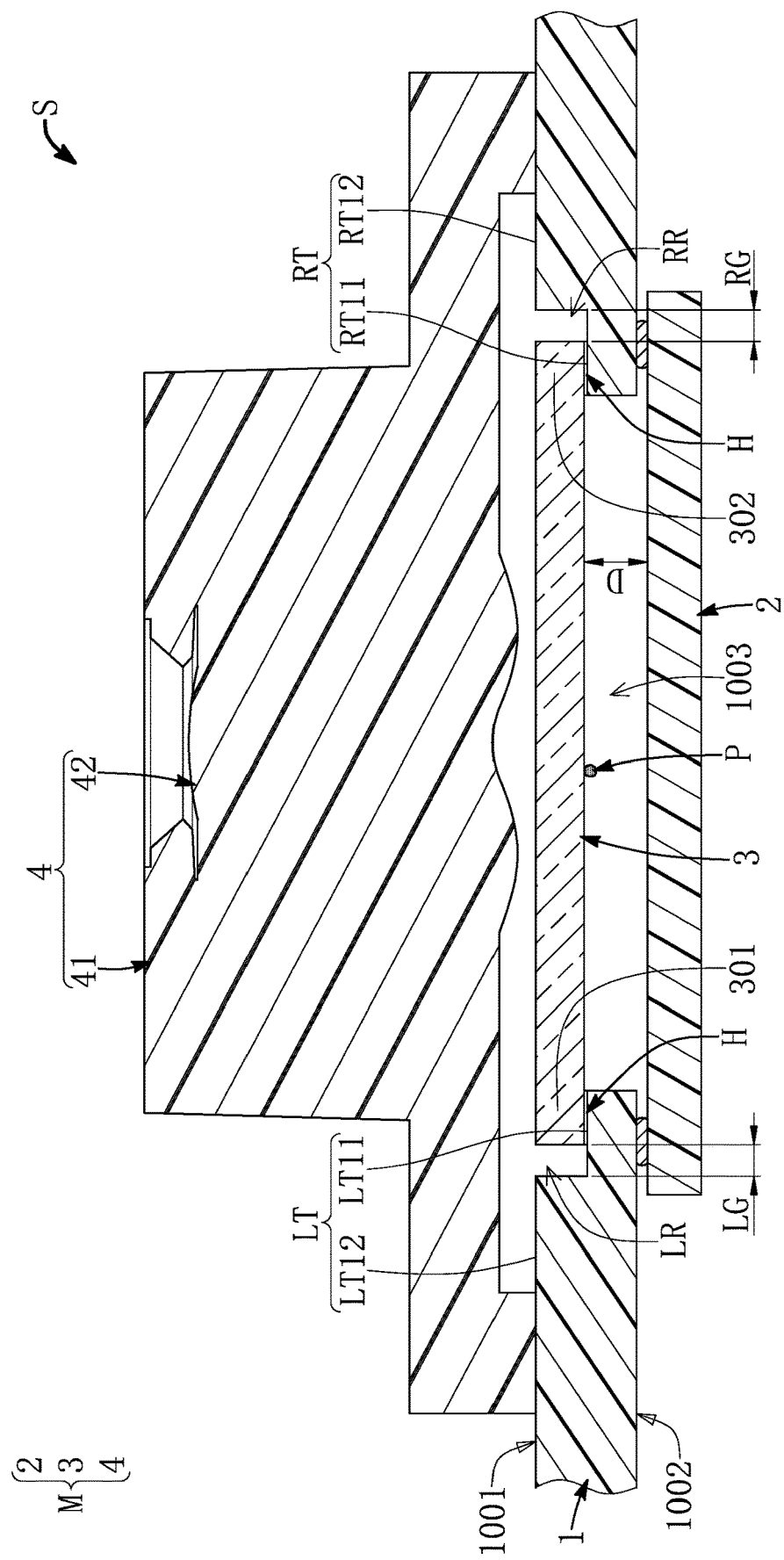
FIG. 1 is a schematic view of an image-capturing device provided by a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
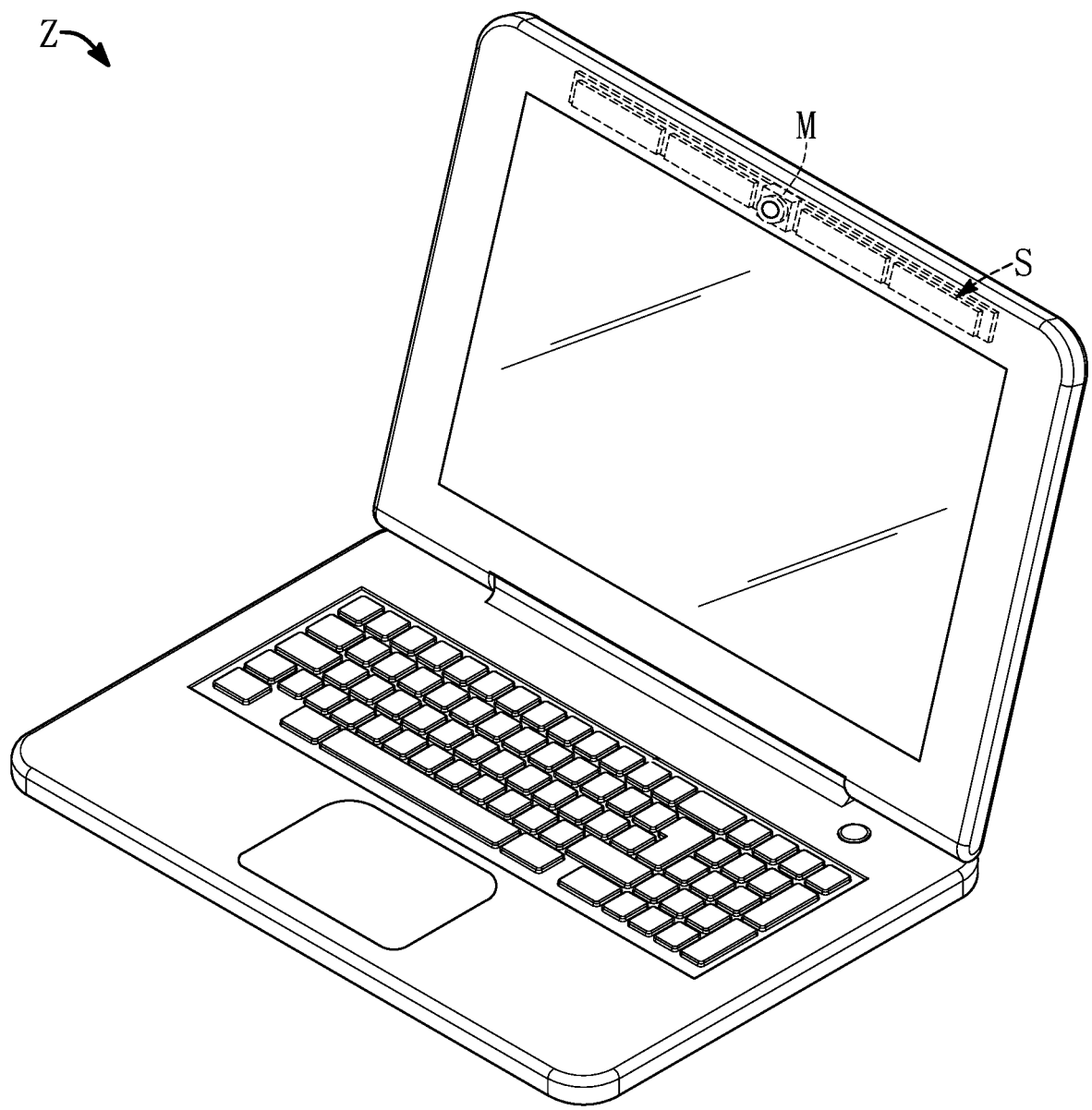
FIG. 2 is a schematic perspective view of a portable electronic device provided by the first embodiment of the present disclosure.
Figure 3:
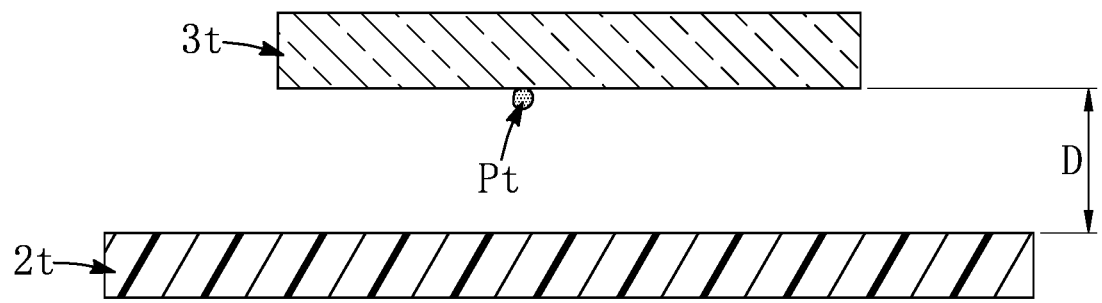
FIG. 3 is a schematic view of a test microparticle, a test image sensing chip and a test filter element used in an assembly method of the image-capturing device according to the first embodiment of the present disclosure.

Referring to FIG. 1 to FIG. 3, a first embodiment of the present disclosure provides an image-capturing device S, which includes a carrier substrate 1, an image sensing chip 2, a filter element 3 and a lens assembly 4. It should be noted that the image sensing chip 2, the filter element 3 and the lens assembly 4 can cooperate with each other to form an image sensing module M for capturing visible light (for example, it can be used to realize image or video capture function) and invisible light (for example, it can be used to realize functions such as face recognition unlocking and anti-peeping, etc.).

Firstly, as shown in FIG. 1, the carrier substrate 1 has a top side 1001, a bottom side 1002, a through opening 1003 (such as a through hole) connected between the top side 1001 and the bottom side 1002, and a recessed space communicated with the through opening 1003. For example, the carrier substrate 1 can be an elongated circuit substrate or a circuit substrate of any shape, and the depth of the recessed space of the carrier substrate 1 may be between 0.1 mm and 0.21 mm. However, the aforementioned details are disclosed for exemplary purposes only, and are not meant to limit the scope of the present disclosure.

Furthermore, as shown in FIG. 1, the image sensing chip 2 is disposed on the bottom side 1002 of the carrier substrate 1 and electrically connected to the carrier substrate 1. For example, the image sensing chip 2 can be a visible light photosensitive chip (using 1980*1280 resolution output) or an infrared photosensitive chip (using 720*640 resolution output). In addition, the image sensing chip 2 can be electrically connected to the carrier substrate 1 through a plurality of conductive materials (such as solder balls, solder paste or any conductor, but not labeled). However, the aforementioned details are disclosed for exemplary purposes only, and are not meant to limit the scope of the present disclosure.

Moreover, as shown in FIG. 1, the filter element 3 can correspond to the image sensing chip 2 on the optical path. The filter element 3 is disposed in the recessed space of the carrier substrate 1, so that all (i.e., 100%) or a part (such as any positive integer percentage between 30% and 99%) of the filter element 3 can be accommodated in the through opening 1003. In this way, the overlapping percentage (i.e., the overlapping ratio) of the filter element 3 and the carrier substrate 1 in the thickness direction can be increased, thereby effectively reducing the overall thickness of the image sensing module M. For example, the filter element 3 can be a visible light filter or an infrared filter (having a wavelength about 850 nm). More particularly, as shown in FIG. 1, the filter element 3 is only connected to the carrier substrate 1 and is not in contact with the image sensing chip 2, and the filter element 3 can be disposed in the recessed space of the carrier substrate 1 through an adhesive layer H or a support element (not shown, for example, the support element can be arranged between the filter element 3 and the carrier substrate 1 for supporting the filter element 3). However, the aforementioned details are disclosed for exemplary purposes only, and are not meant to limit the scope of the present disclosure.

In addition, as shown in FIG. 1, the lens assembly 4 can correspond to the image sensing chip 2 on the optical path, and the lens assembly 4 includes a lens holder 41 disposed on the top side 1001 of the carrier substrate 1 and an optical lens 42 carried by the lens holder 41. For example, the optical lens 42 can be a visible light lens or an infrared lens (having a wavelength about 850 nm). In addition, when a top side of the filter element 3 is flush with the top side 1001 of the carrier substrate 1, at least one of the lens holder 41 and the optical lens 42 of the lens assembly 4 is arranged on the top side 1001 of the carrier substrate 1 and the top side of the filter element 3 (or in other words, the lens holder 41 can downward contact or abut against the filter element 3 or be separated from the filter element 3). However, the aforementioned details are disclosed for exemplary purposes only, and are not meant to limit the scope of the present disclosure.

Furthermore, as shown in FIG. 1, the recessed space of the carrier substrate 1 can be a first recessed space formed on the top side 1001 of the carrier substrate 1, and the filter element 3 is disposed in the first recessed space of the carrier substrate 1. For example, the top side 1001 of the carrier substrate 1 has a left top carrier surface LT and a right top carrier surface RT, the left top carrier surface LT has an inner surface LT11 and an outer surface LT12 that have a height difference (i.e., a height difference between the inner surface LT11 and the outer surface LT12 of the left top carrier surface LT), and the right top carrier surface RT has an inner surface RT11 and an outer surface RT12 that have a height difference (i.e., a height difference between the inner surface RT11 and the outer surface RT12 of the right top carrier surface RT). In addition, the inner surface LT11 of the left top carrier surface LT and the inner surface RT11 of the right top carrier surface RT can be configured to carry the filter element 3, and the outer surface LT12 of the left top carrier surface LT and the outer surface RT12 of the right top carrier surface RT can be configured to carry the lens holder 41. More particularly, the inner surface LT11 and the outer surface LT12 of the left top carrier surface LT have a height difference, and the inner surface RT11 and the outer surface RT12 of the right top carrier surface RT have a height difference, so that the carrier substrate 1 can provide a left recessed space LR and a right recessed space RR (that is to say, the first recessed space has a left recessed space LR and a right recessed space RR) for respectively accommodating a left portion 301 and a right portion 302 of the filter element 3, thereby reducing a shortest distance D between the filter element 3 and the image sensing chip 2. It should be noted that, according to different requirements, both the left recessed space LR and the right recessed space RR can be separate from each other without communicating with each other, or connected and communicated with each other. However, the aforementioned details are disclosed for exemplary purposes only, and are not meant to limit the scope of the present disclosure.

It should be noted that as shown in FIG. 1, the left recessed space LR of the carrier substrate 1 has a left gap LG located between the carrier substrate 1 and the left portion 301 of the filter element 3, and the left gap LG is not filled by any material to form a left unoccupied area. In addition, the right recessed space RR of the carrier substrate 1 has a right gap RG located between the carrier substrate 1 and the right portion 302 of the filter element 3, and the right gap RG is not filled by any material to form a right unoccupied area.

Therefore, when at least one microparticle P with a maximum particle size between 5 μm and 25 μm (for example, according to different environmental considerations, it can be any positive integer between 5 μm and 25 μm, or an interval defined by any two positive integers between 5 μm and 25 μm, such as between 5 μm and 15 μm, or between 15 μm and 25 μm) is located on the filter element 3, a shortest distance D between the filter element 3 and the image sensing chip 2 is between 30 μm and 200 μm (for example, according to different application product considerations, it can be any positive integer between 30 μm and 200 μm, or an interval defined by any two positive integers between 30 μm and 200 μm, such as between 30 μm and 80 μm, or between 80 μm and 130 μm, or between 130 μm and 200 μm), so that the image sensing chip 2 cannot capture a light spot (or an image spot) generated due to blocking (or shielding) of the at least one microparticle P. That is to say, the at least one microparticle P with a maximum particle size between 5 μm and 25 μm can be separated from the image sensing chip 2 by a sufficient distance due to the setting of the shortest distance D, so that the image sensing chip 2 will not capture the image of the at least one microparticle P, and the at least one microparticle P will not be imaged on the image sensing chip 2, thereby improving the image-capturing quality of the image sensing chip 2.

More particularly, referring to FIG. 1 and FIG. 2, the first embodiment of the present disclosure further includes a portable electronic device Z using an image-capturing device S that at least includes the image sensing module M. For example, the portable electronic device Z can be a notebook computer, a tablet computer or a smart mobile phone. In addition, the image-capturing device S further includes an electrical connector (not shown), an ambient light sensor (not shown), an infrared generator (not shown), an image processor (not shown) and a sound receiver (not shown). However, the aforementioned details are disclosed for exemplary purposes only, and are not meant to limit the scope of the present disclosure.

More particularly, referring to FIG. 1 and FIG. 3, the first embodiment of the present disclosure further includes an assembly method of an image-capturing device S, which includes: firstly, as shown in FIG. 3, placing at least one test microparticle Pt (such as a physical or virtual microparticle) with a maximum particle size between 5 μm and 25 μm on a test filter element 3t (such as a physical or virtual filter element); next, as shown in FIG. 3, adjusting a shortest distance D from the test filter element 3t to a test image sensor chip 2t until the test image sensor chip 2t cannot capture a light spot (or an image spot) generated due to blocking of the at least one test microparticle Pt, in order to obtain a reference data of the shortest distance D between the test filter element 3t and the test image sensor chip 2t ranging from 30 μm to 200 μm; and then as shown in FIG. 1, according to the reference data, placing an image sensing chip 2, a filter element 3 and a lens assembly 4 on a carrier substrate 1 so as to define a shortest distance D between the filter element 3 and the image sensing chip 2 ranging from 30 μm to 200 μm. For example, the assembly method of the image-capturing device S provided by the first embodiment of the present disclosure further includes: placing an electrical connector (not shown), an ambient light sensor (not shown), an infrared generator (not shown), an image processor (not shown) and a sound receiver (not shown) on the top side 1001 of the carrier substrate 1 to electrically connect to the carrier substrate 1. However, the aforementioned details are disclosed for exemplary purposes only, and are not meant to limit the scope of the present disclosure.

Second Embodiment

Figure 4:
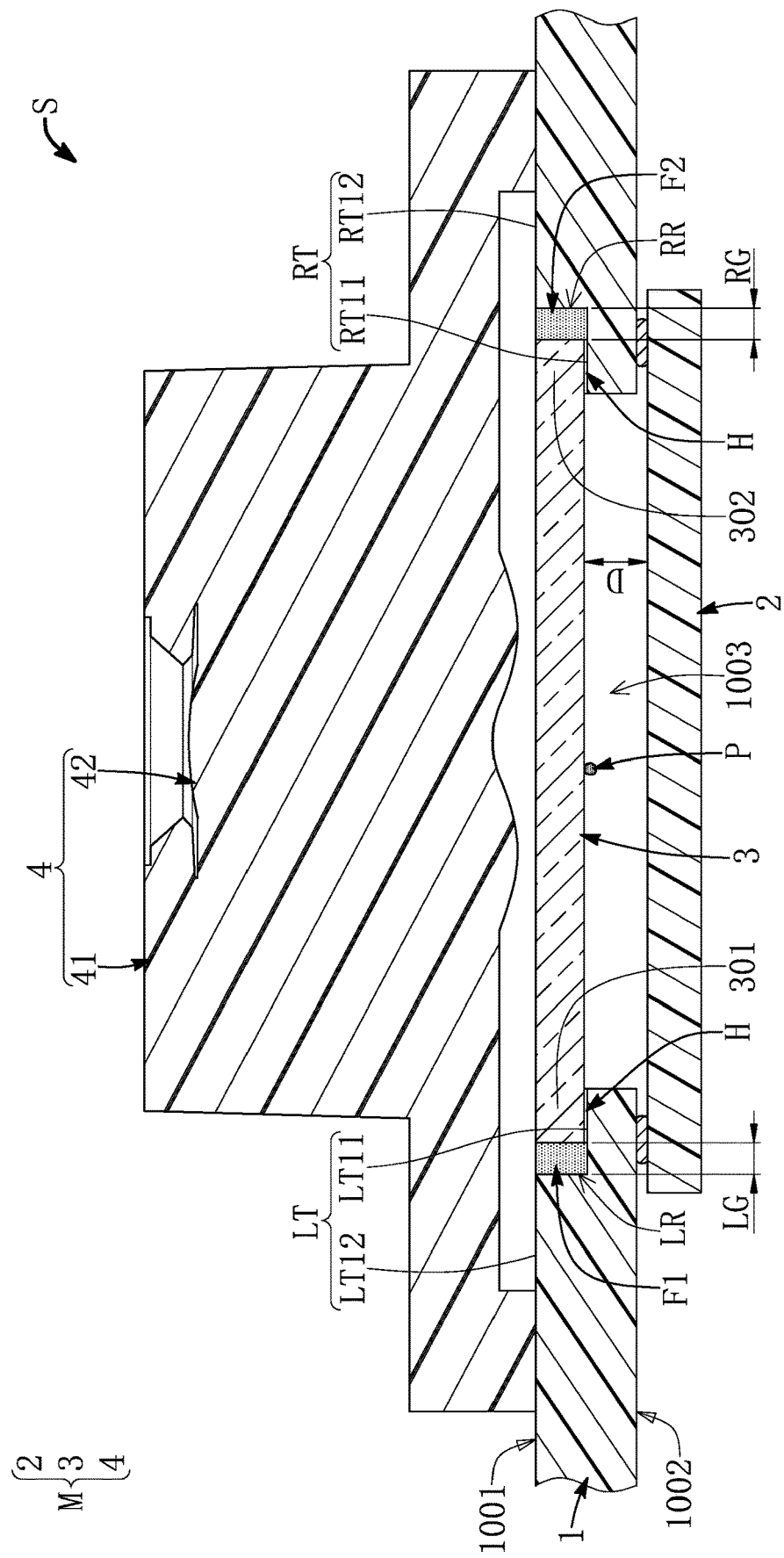
FIG. 4 is a schematic view of the image-capturing device provided by a second embodiment of the present disclosure.

Referring to FIG. 4, a second embodiment of the present disclosure provides an image-capturing device S. From the comparison of FIG. 4 with FIG. 1, the main difference between the second embodiment and the first embodiment is as follows: in the second embodiment, the left recessed space LR of the carrier substrate 1 has a left gap LG located between the carrier substrate 1 and the left portion 301 of the filter element 3, and the left gap LG can be filled with a first filler F1 (such as elastic filler, viscous filler or any filler material) to form a left filling area. In addition, the right recessed space RR of the carrier substrate 1 has a right gap RG located between the carrier substrate 1 and the right portion 302 of the filter element 3, and the right gap RG can be filled with a second filler F2 (such as elastic filler, viscous filler or any filler material) to form a right filling area. Thereby, the filter element 3 can be more firmly disposed in a first recessed space formed by the left recessed space LR and the right recessed space RR through the use of the first filler F1 and the second filler F2.

Third Embodiment

Figure 5:
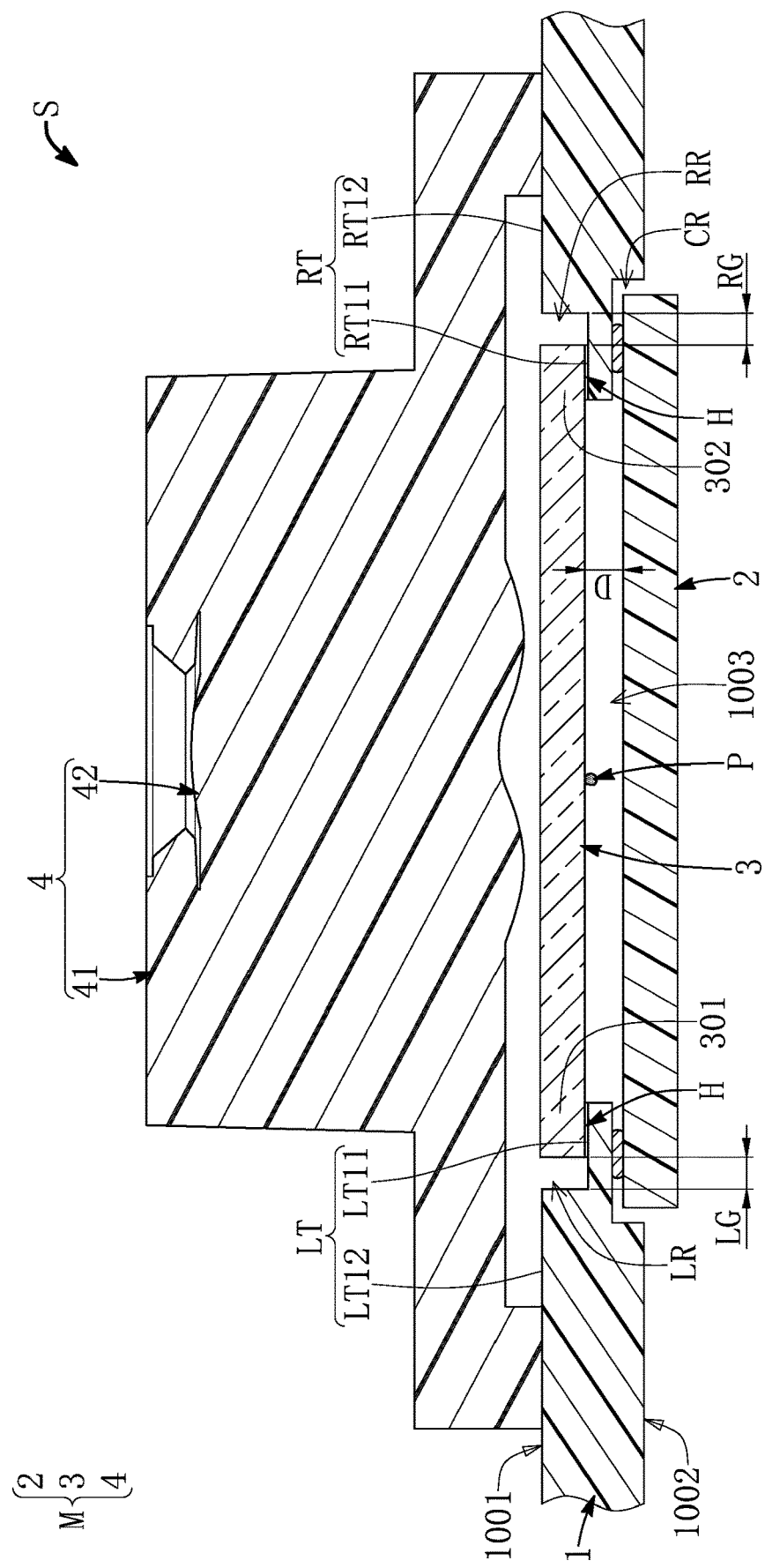
FIG. 5 is a schematic view of the image-capturing device provided by a third embodiment of the present disclosure.

Referring to FIG. 5, a third embodiment of the present disclosure provides an image-capturing device S. From the comparison of FIG. 5 with FIG. 1, the main difference between the third embodiment and the first embodiment is as follows: in the third embodiment, the carrier substrate 1 has a chip accommodating space CR formed on the bottom side 1002 and communicated with the through opening 1003, and the image sensing chip 2 can be completely (i.e., 100%) or partially (such as any positive integer percentage between 30% and 99%) disposed in the chip accommodating space CR of the carrier substrate 1. In this way, the overlapping percentage (i.e., the overlapping ratio) of the image sensing chip 2 and the carrier substrate 1 in the thickness direction can be increased, thereby effectively reducing the overall thickness of the image sensing module M.

Fourth Embodiment

Figure 6:
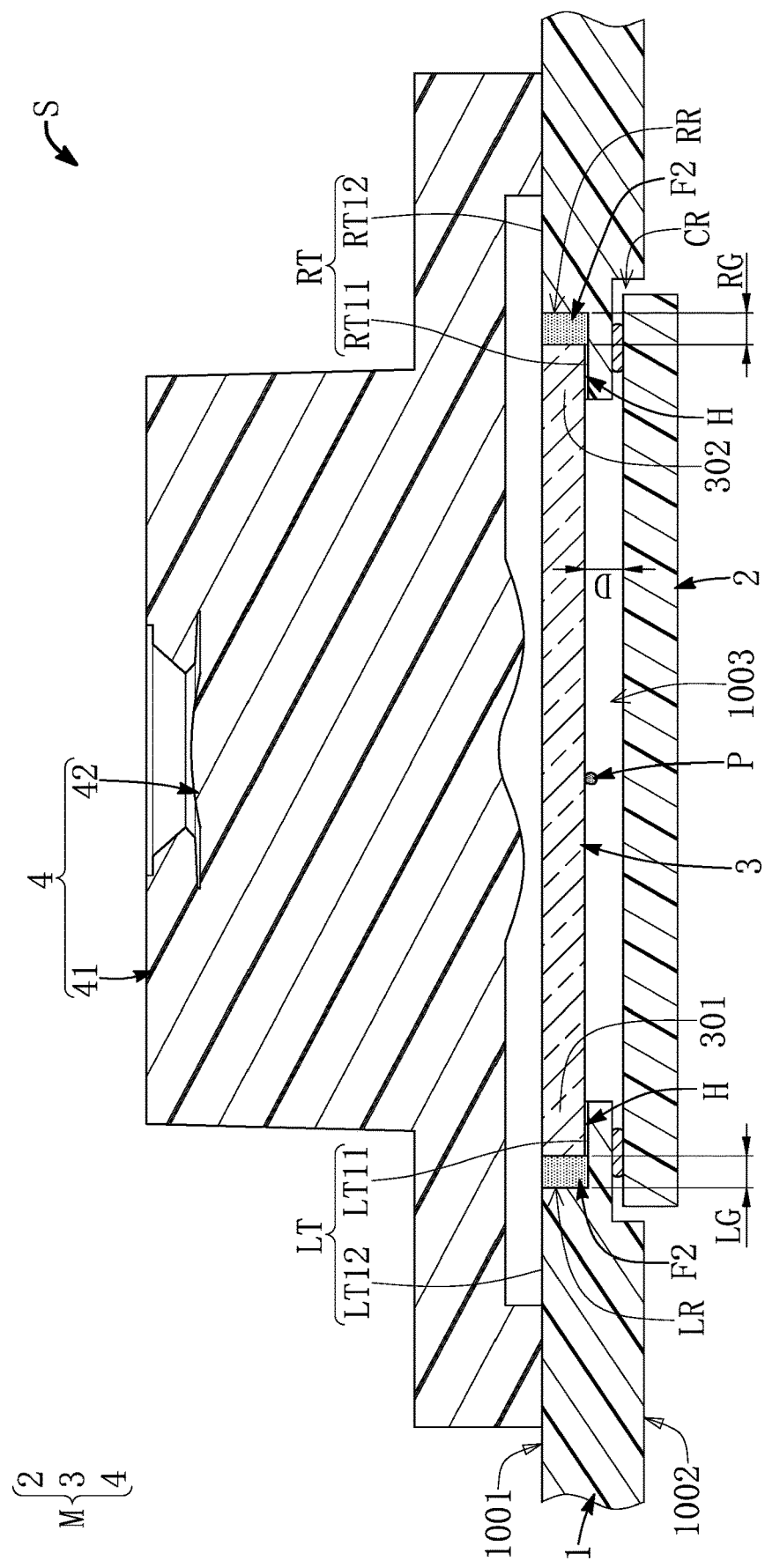
FIG. 6 is a schematic view of the image-capturing device provided by a fourth embodiment of the present disclosure.

Referring to FIG. 6, a fourth embodiment of the present disclosure provides an image-capturing device S. From the comparison of FIG. 6 with FIG. 5, the main difference between the fourth embodiment and the third embodiment is as follows: in the fourth embodiment, the left recessed space LR of the carrier substrate 1 has a left gap LG located between the carrier substrate 1 and the left portion 301 of the filter element 3, and the left gap LG can be filled with a first filler F1 (such as elastic filler, viscous filler or any filler material) to form a left filling area. In addition, the right recessed space RR of the carrier substrate 1 has a right gap RG located between the carrier substrate 1 and the right portion 302 of the filter element 3, and the right gap RG can be filled with a second filler F2 (such as elastic filler, viscous filler or any filler material) to form a right filling area. Thereby, the filter element 3 can be more firmly disposed in a first recessed space formed by the left recessed space LR and the right recessed space RR through the use of the first filler F1 and the second filler F2.

Fifth Embodiment

Figure 7:
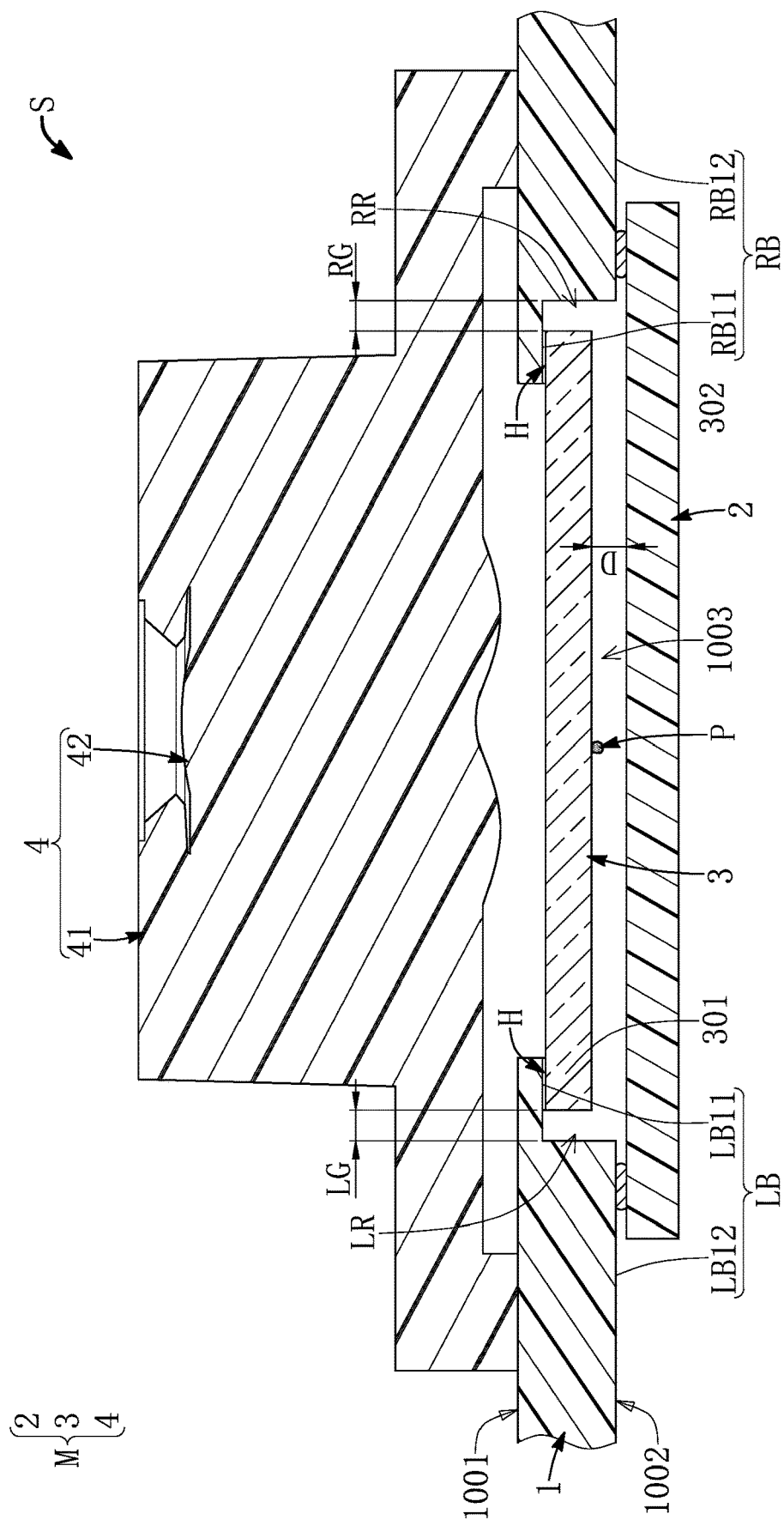
FIG. 7 is a schematic view of the image-capturing device provided by a fifth embodiment of the present disclosure.

Referring to FIG. 7, a fifth embodiment of the present disclosure provides an image-capturing device S. From the comparison of FIG. 7 with FIG. 1, the main difference between the fifth embodiment and the first embodiment is as follows: in the fifth embodiment, the recessed space of the carrier substrate 1 can be a second recessed space formed on the bottom side 1002 of the carrier substrate 1, and the filter element 3 is disposed in the second recessed space of the carrier substrate 1, thereby reducing the shortest distance D between the filter element 3 and the image sensing chip 2 (that is to say, the shortest distance D shown in FIG. 7 can be smaller than the shortest distance D shown in FIG. 1).

More particularly, as shown in FIG. 5, the bottom side 1002 of the carrier substrate 1 has a left bottom carrier surface LB and a right bottom carrier surface RB, the left bottom carrier surface LB has an inner surface LB11 and an outer surface LB12 that have a height difference (i.e., a height difference between the inner surface LB11 and the outer surface LB12 of the left bottom carrier surface LB), and the right bottom carrier surface RB has an inner surface RB11 and an outer surface RB12 that have a height difference (i.e., a height difference between the inner surface RB11 and the outer surface RB12 of the right bottom carrier surface RB). In addition, the inner surface LB11 of the left bottom carrier surface LB and the inner surface RB11 of the right bottom carrier surface RB can be configured to carry the filter element 3, and the outer surface LB12 of the left bottom carrier surface LB and the outer surface RB12 of the right bottom carrier surface RB can be configured to carry the image sensing chip 2.

More particularly, as shown in FIG. 5, the inner surface LB11 and the outer surface LB12 of the left bottom carrier surface LB have a height difference, and the inner surface RB11 and the outer surface RB12 of the right bottom carrier surface RB have a height difference, so that the carrier substrate 1 can provide a left recessed space LR and a right recessed space RR (that is to say, the second recessed space has a left recessed space LR and a right recessed space RR) for respectively accommodating a left portion 301 and a right portion 302 of the filter element 3, thereby reducing a shortest distance D between the filter element 3 and the image sensing chip 2. It should be noted that, according to different requirements, both the left recessed space LR and the right recessed space RR can be separate from each other without communicating with each other, or connected and communicated with each other. However, the aforementioned details are disclosed for exemplary purposes only, and are not meant to limit the scope of the present disclosure.

Sixth Embodiment

Figure 8:
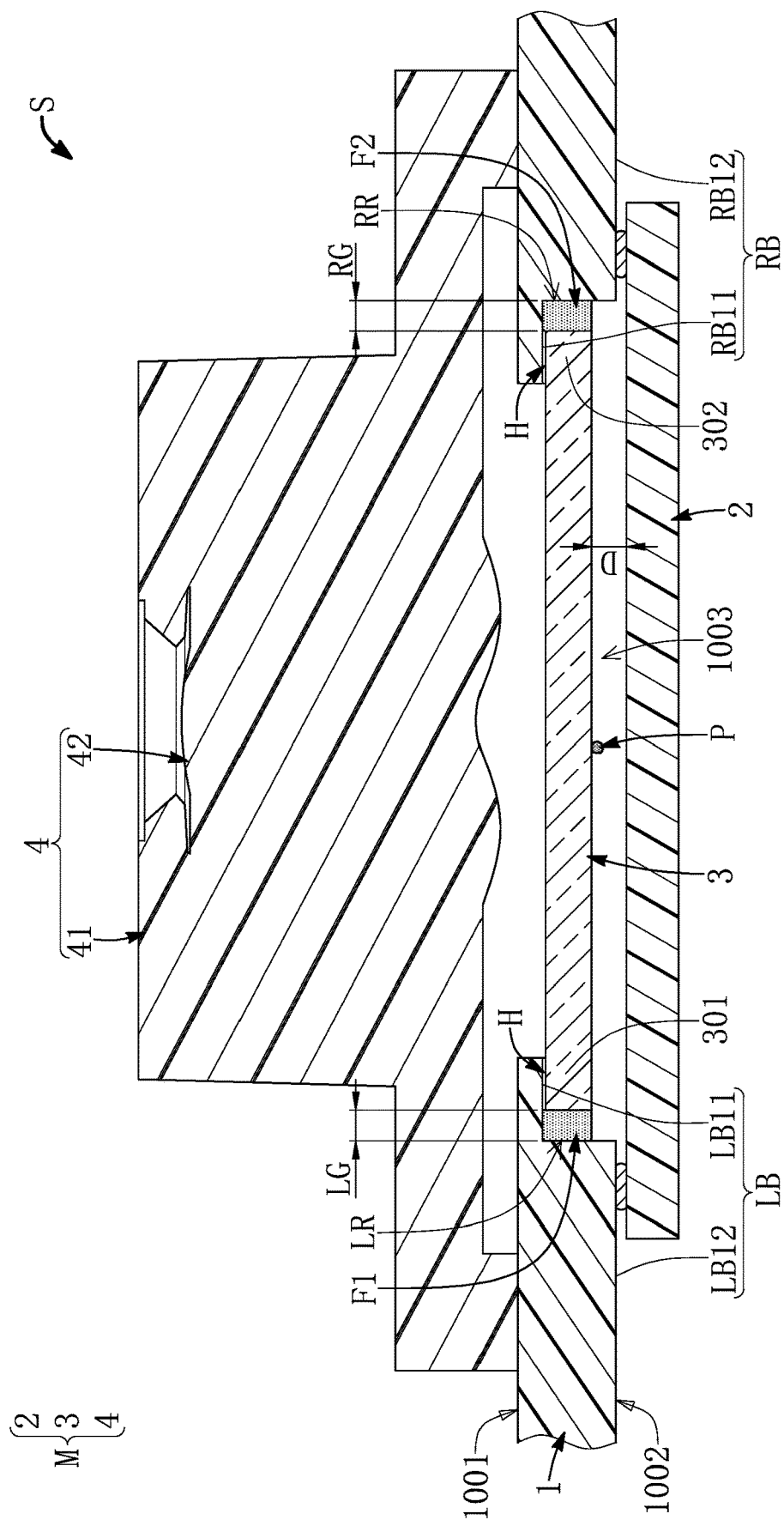
FIG. 8 is a schematic view of the image-capturing device provided by a sixth embodiment of the present disclosure.

Referring to FIG. 8, a sixth embodiment of the present disclosure provides an image-capturing device S. From the comparison of FIG. 8 with FIG. 7, the main difference between the sixth embodiment and the fifth embodiment is as follows: in the sixth embodiment, the left recessed space LR of the carrier substrate 1 has a left gap LG located between the carrier substrate 1 and the left portion 301 of the filter element 3, and the left gap LG can be filled with a first filler F1 (such as elastic filler, viscous filler or any filler material) to form a left filling area. In addition, the right recessed space RR of the carrier substrate 1 has a right gap RG located between the carrier substrate 1 and the right portion 302 of the filter element 3, and the right gap RG can be filled with a second filler F2 (such as elastic filler, viscous filler or any filler material) to form a right filling area. Thereby, the filter element 3 can be more firmly disposed in a first recessed space formed by the left recessed space LR and the right recessed space RR through the use of the first filler F1 and the second filler F2.

Beneficial Effects of the Embodiments

In conclusion, in the image-capturing device S provided by the present disclosure, by virtue of "the carrier substrate 1 having a top side 1001, a bottom side 1002, a through opening 1003 connected between the top side 1001 and the bottom side 1002, and a recessed space communicated with the through opening 1003," "the image sensing chip 2 being disposed on the bottom side 1002 of the carrier substrate 1 and electrically connected to the carrier substrate 1" and "the filter element 3 being disposed in the recessed space of the carrier substrate 1, so that all or a part of the filter element 3 is accommodated in the through opening 1003," the image-capturing quality of the image-capturing device S can be improved. More particularly, when at least one microparticle P with a maximum particle size between 5 µm and 25 µm is located on the filter element 3, a shortest distance D between the filter element 3 and the image sensing chip 2 is between 30 µm and 200 µm, so that the image sensing chip 2 cannot capture a light spot generated due to blocking of the at least one microparticle P.

Moreover, in the assembly method of the image-capturing device S provided by the present disclosure, by virtue of "placing at least one test microparticle Pt with a maximum particle size between 5 µm and 25 µm on a test filter element 3t," "adjusting a shortest distance D from the test filter element 3t to a test image sensor chip 2t until the test image sensor chip 2t cannot capture a light spot generated due to blocking of the at least one test microparticle Pt, in order to obtain a reference data of the shortest distance D between the test filter element 3t and the test image sensor chip 2t ranging from 30 µm to 200 µm" and "according to the reference data, placing an image sensing chip 2, a filter assembly and a lens assembly 4 on a carrier substrate 1, so that a shortest distance D between the filter element 3 and the image sensing chip 2 is between 30 µm and 200 µm," the image-capturing quality of the image-capturing device S can be improved. More particularly, when at least one microparticle P with a maximum particle size between 5 µm and 25 µm is located on the filter element 3, a shortest distance D between the filter element 3 and the image sensing chip 2 is between 30 µm and 200 µm, so that the image sensing chip 2 cannot capture a light spot generated due to blocking of the at least one microparticle P.

Furthermore, in the portable electronic device using the image-capturing device S provided by the present disclosure, by virtue of "the carrier substrate 1 having a top side 1001, a bottom side 1002, a through opening 1003 connected between the top side 1001 and the bottom side 1002, and a recessed space communicated with the through opening 1003," "the image sensing chip 2 being disposed on the bottom side 1002 of the carrier substrate 1 and electrically connected to the carrier substrate 1" and "the filter element 3 being disposed in the recessed space of the carrier substrate 1, so that all or a part of the filter element 3 is accommodated in the through opening 1003," the image-capturing quality of the image-capturing device S that is used by the portable electronic device can be improved. More particularly, when at least one microparticle P with a maximum particle size between 5 µm and 25 µm is located on the filter element 3, a shortest distance D between the filter element 3 and the image sensing chip 2 is between 30 µm and 200 µm, so that the image sensing chip 2 cannot capture a light spot generated due to blocking of the at least one microparticle P.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image-capturing device, comprising:
a carrier substrate having a top side, a bottom side, a through opening connected between the top side and the bottom side, and a recessed space communicated with the through opening;
an image sensing chip disposed on the bottom side of the carrier substrate and electrically connected to the carrier substrate;
a filter element corresponding to the image sensing chip, wherein the filter element is disposed in the recessed space of the carrier substrate, so that all or a part of the filter element is accommodated in the through opening; and
a lens assembly corresponding to the image sensing chip, wherein the lens assembly includes a lens holder disposed on the top side of the carrier substrate and an optical lens carried by the lens holder;
wherein, when at least one microparticle with a maximum particle size between 5 μm and 25 μm is located on the filter element, a shortest distance between the filter element and the image sensing chip is between 30 μm and 200 μm, so that the image sensing chip cannot capture a light spot generated due to blocking of the at least one microparticle.

2. The image-capturing device according to claim 1,
wherein the recessed space of the carrier substrate is a first recessed space formed on the top side of the carrier substrate, and the filter element is disposed in the first recessed space of the carrier substrate;
wherein the top side of the carrier substrate has a left top carrier surface and a right top carrier surface, the left top carrier surface has an inner surface and an outer surface that have a height difference, and the right top carrier surface has an inner surface and an outer surface that have a height difference;
wherein the inner surface of the left top carrier surface and the inner surface of the right top carrier surface are configured to carry the filter element, and the outer surface of the left top carrier surface and the outer surface of the right top carrier surface are configured to carry the lens holder;
wherein the carrier substrate provides a left recessed space and a right recessed space for respectively accommodating a left portion and a right portion of the filter element, thereby reducing a shortest distance between the filter element and the image sensing chip;
wherein the left recessed space of the carrier substrate has a left gap located between the carrier substrate and the left portion of the filter element, and the right recessed space of the carrier substrate has a right gap located between the carrier substrate and the right portion of the filter element;
wherein the left gap is not filled to form a left unoccupied area or is filled with a first filler to form a left filling area;
wherein the right gap is not filled to form a right unoccupied area or is filled with a second filler to form a right filling area.

3. The image-capturing device according to claim 1,
wherein the recessed space of the carrier substrate is a second recessed space formed on the bottom side of the carrier substrate, and the filter element is disposed in the second recessed space of the carrier substrate;
wherein the bottom side of the carrier substrate has a left bottom carrier surface and a right bottom carrier surface, the left bottom carrier surface has an inner surface and an outer surface that have a height difference, and the right bottom carrier surface has an inner surface and an outer surface that have a height difference;
wherein the inner surface of the left bottom carrier surface and the inner surface of the right bottom carrier surface are configured to carry the filter element, and the outer surface of the left bottom carrier surface and the outer surface of the right bottom carrier surface are configured to carry the image sensing chip;
wherein the carrier substrate provides a left recessed space and a right recessed space for respectively accommodating a left portion and a right portion of the filter element, thereby reducing a shortest distance between the filter element and the image sensing chip.

4. The image-capturing device according to claim 1,
wherein the carrier substrate has a chip accommodating space formed on the bottom side and communicated with the through opening, and the image sensing chip is completely or partially disposed in the chip accommodating space of the carrier substrate;
wherein the image sensing chip is electrically connected to the carrier substrate through a plurality of conductive materials;
wherein a depth of the recessed space of the carrier substrate is between 0.1 mm and 0.21 mm;
wherein the filter element is disposed in the recessed space of the carrier substrate through an adhesive layer or a support element;
wherein, a top side of the filter element is flush with the top side of the carrier substrate, and at least one of the lens holder and the optical lens of the lens assembly is disposed on the top side of the carrier substrate and the top side of the filter element.

5. An assembly method of an image-capturing device, comprising:
placing at least one test microparticle with a maximum particle size between 5 μm and 25 μm on a test filter element;
adjusting a shortest distance from the test filter element to a test image sensor chip until the test image sensor chip cannot capture a light spot generated due to blocking of the at least one test microparticle, in order to obtain a reference data of the shortest distance between the test filter element and the test image sensor chip ranging from 30 μm to 200 μm; and
according to the reference data, placing an image sensing chip, a filter assembly and a lens assembly on a carrier substrate, so that a shortest distance between the filter element and the image sensing chip is between 30 μm and 200 μm;
wherein the carrier substrate has a top side, a bottom side, a through opening connected between the top side and the bottom side, and a recessed space communicated with the through opening;
wherein the image sensing chip is disposed on the bottom side of the carrier substrate and electrically connected to the carrier substrate;
wherein the filter element is configured for corresponding to the image sensing chip, and the filter element is disposed in the recessed space of the carrier substrate, so that all or a part of the filter element is accommodated in the through opening;
wherein the lens assembly is configured for corresponding to the image sensing chip, and the lens assembly includes a lens holder disposed on the top side of the carrier substrate and an optical lens carried by the lens holder;

wherein, when at least one microparticle with a maximum particle size between 5 μm and 25 μm is located on the filter element, a shortest distance between the filter element and the image sensing chip is between 30 μm and 200 μm, so that the image sensing chip cannot capture a light spot generated due to blocking of the at least one microparticle.

6. The assembly method of the image-capturing device according to claim 5,
wherein the recessed space of the carrier substrate is a first recessed space formed on the top side of the carrier substrate, and the filter element is disposed in the first recessed space of the carrier substrate;
wherein the top side of the carrier substrate has a left top carrier surface and a right top carrier surface, the left top carrier surface has an inner surface and an outer surface that have a height difference, and the right top carrier surface has an inner surface and an outer surface that have a height difference;
wherein the inner surface of the left top carrier surface and the inner surface of the right top carrier surface are configured to carry the filter element, and the outer surface of the left top carrier surface and the outer surface of the right top carrier surface are configured to carry the lens holder;
wherein the carrier substrate provides a left recessed space and a right recessed space for respectively accommodating a left portion and a right portion of the filter element, thereby reducing a shortest distance between the filter element and the image sensing chip;
wherein the left recessed space of the carrier substrate has a left gap located between the carrier substrate and the left portion of the filter element, and the right recessed space of the carrier substrate has a right gap located between the carrier substrate and the right portion of the filter element;
wherein the left gap is not filled to form a left unoccupied area or is filled with a first filler to form a left filling area;
wherein the right gap is not filled to form a right unoccupied area or is filled with a second filler to form a right filling area;
wherein the carrier substrate has a chip accommodating space formed on the bottom side and communicated with the through opening, and the image sensing chip is completely or partially disposed in the chip accommodating space of the carrier substrate;
wherein the image sensing chip is electrically connected to the carrier substrate through a plurality of conductive materials;
wherein a depth of the recessed space of the carrier substrate is between 0.1 mm and 0.21 mm;
wherein the filter element is disposed in the recessed space of the carrier substrate through an adhesive layer or a support element;
wherein, a top side of the filter element is flush with the top side of the carrier substrate, and at least one of the lens holder and the optical lens of the lens assembly is disposed on the top side of the carrier substrate and the top side of the filter element.

7. The assembly method of the image-capturing device according to claim 5,
wherein the recessed space of the carrier substrate is a second recessed space formed on the bottom side of the carrier substrate, and the filter element is disposed in the second recessed space of the carrier substrate;
wherein the bottom side of the carrier substrate has a left bottom carrier surface and a right bottom carrier surface, the left bottom carrier surface has an inner surface and an outer surface that have a height difference, and the right bottom carrier surface has an inner surface and an outer surface that have a height difference;
wherein the inner surface of the left bottom carrier surface and the inner surface of the right bottom carrier surface are configured to carry the filter element, and the outer surface of the left bottom carrier surface and the outer surface of the right bottom carrier surface are configured to carry the image sensing chip;
wherein the carrier substrate provides a left recessed space and a right recessed space for respectively accommodating a left portion and a right portion of the filter element, thereby reducing a shortest distance between the filter element and the image sensing chip.

8. A portable electronic device configured to use an image-capturing device, wherein the image-capturing device comprises:
a carrier substrate having a top side, a bottom side, a through opening connected between the top side and the bottom side, and a recessed space communicated with the through opening;
an image sensing chip disposed on the bottom side of the carrier substrate and electrically connected to the carrier substrate;
a filter element corresponding to the image sensing chip, wherein the filter element is disposed in the recessed space of the carrier substrate, so that all or a part of the filter element is accommodated in the through opening; and
a lens assembly corresponding to the image sensing chip, wherein the lens assembly includes a lens holder disposed on the top side of the carrier substrate and an optical lens carried by the lens holder;
wherein, when at least one microparticle with a maximum particle size between 5 μm and 25 μm is located on the filter element, a shortest distance between the filter element and the image sensing chip is between 30 μm and 200 μm, so that the image sensing chip cannot capture a light spot generated due to blocking of the at least one microparticle.

9. The portable electronic device according to claim 8,
wherein the recessed space of the carrier substrate is a first recessed space formed on the top side of the carrier substrate, and the filter element is disposed in the first recessed space of the carrier substrate;
wherein the top side of the carrier substrate has a left top carrier surface and a right top carrier surface, the left top carrier surface has an inner surface and an outer surface that have a height difference, and the right top carrier surface has an inner surface and an outer surface that have a height difference;
wherein the inner surface of the left top carrier surface and the inner surface of the right top carrier surface are configured to carry the filter element, and the outer surface of the left top carrier surface and the outer surface of the right top carrier surface are configured to carry the lens holder;
wherein the carrier substrate provides a left recessed space and a right recessed space for respectively accommodating a left portion and a right portion of the filter element, thereby reducing a shortest distance between the filter element and the image sensing chip;
wherein the left recessed space of the carrier substrate has a left gap located between the carrier substrate and the left portion of the filter element, and the right recessed space of the carrier substrate has a right gap located between the carrier substrate and the right portion of the filter element;

wherein the left gap is not filled to form a left unoccupied area or is filled with a first filler to form a left filling area;

wherein the right gap is not filled to form a right unoccupied area or is filled with a second filler to form a right filling area;

wherein the carrier substrate has a chip accommodating space formed on the bottom side and communicated with the through opening, and the image sensing chip is completely or partially disposed in the chip accommodating space of the carrier substrate;

wherein the image sensing chip is electrically connected to the carrier substrate through a plurality of conductive materials;

wherein a depth of the recessed space of the carrier substrate is between 0.1 mm and 0.21 mm;

wherein the filter element is disposed in the recessed space of the carrier substrate through an adhesive layer or a support element;

wherein, a top side of the filter element is flush with the top side of the carrier substrate, and at least one of the lens holder and the optical lens of the lens assembly is disposed on the top side of the carrier substrate and the top side of the filter element.

10. The portable electronic device according to claim 8, wherein the recessed space of the carrier substrate is a second recessed space formed on the bottom side of the carrier substrate, and the filter element is disposed in the second recessed space of the carrier substrate;

wherein the bottom side of the carrier substrate has a left bottom carrier surface and a right bottom carrier surface, the left bottom carrier surface has an inner surface and an outer surface that have a height difference, and the right bottom carrier surface has an inner surface and an outer surface that have a height difference;

wherein the inner surface of the left bottom carrier surface and the inner surface of the right bottom carrier surface are configured to carry the filter element, and the outer surface of the left bottom carrier surface and the outer surface of the right bottom carrier surface are configured to carry the image sensing chip;

wherein the carrier substrate provides a left recessed space and a right recessed space for respectively accommodating a left portion and a right portion of the filter element, thereby reducing a shortest distance between the filter element and the image sensing chip.

\* \* \* \* \*